United States Patent
Shibata

(10) Patent No.: US 6,487,629 B1
(45) Date of Patent: Nov. 26, 2002

(54) SEMICONDUCTOR MEMORY FOR OPERATION IN A PLURALITY OF OPERATIONAL MODES

(75) Inventor: Hidetaka Shibata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/263,780

(22) Filed: Mar. 5, 1999

(30) Foreign Application Priority Data

Aug. 19, 1998 (JP) .......................................... 10-232844

(51) Int. Cl.⁷ .............................................. G06F 12/00
(52) U.S. Cl. ...................... 711/104; 711/100; 711/154
(58) Field of Search ................................. 711/100, 102, 711/104, 154; 365/185.24, 191, 230.05

(56) References Cited

U.S. PATENT DOCUMENTS 5,042,013 A * 8/1991 Sato ........................ 365/230.05
5,130,704 A * 7/1992 Ogawa et al. .............. 345/204
5,297,029 A * 3/1994 Nakai et al. ............. 365/238.5
5,559,736 A * 9/1996 Matsukawa et al. ... 365/185.24
6,101,135 A * 8/2000 Lee .............................. 365/191

FOREIGN PATENT DOCUMENTS

JP  9-251773  9/1997
KR  97-71798  11/1997

* cited by examiner

Primary Examiner—Tuan V. Thai

(57) ABSTRACT

A semiconductor memory includes an instruction decoder, a register for storing operational mode information, a memory core for storing data, and a mode set-up control circuit. The memory operates in a number of modes, such as a read mode, a write mode and a set-up mode. When performing a read or a write command, access information for the command is stored in the register. In order to operate the memory more efficiently, the mode set-up control circuit prestores memory access information. Then, at the end of a read or write command, the prestored access information is loaded into the register. Locally storing the access information prevents the memory from having to wait to receive such information from an external element.

14 Claims, 5 Drawing Sheets

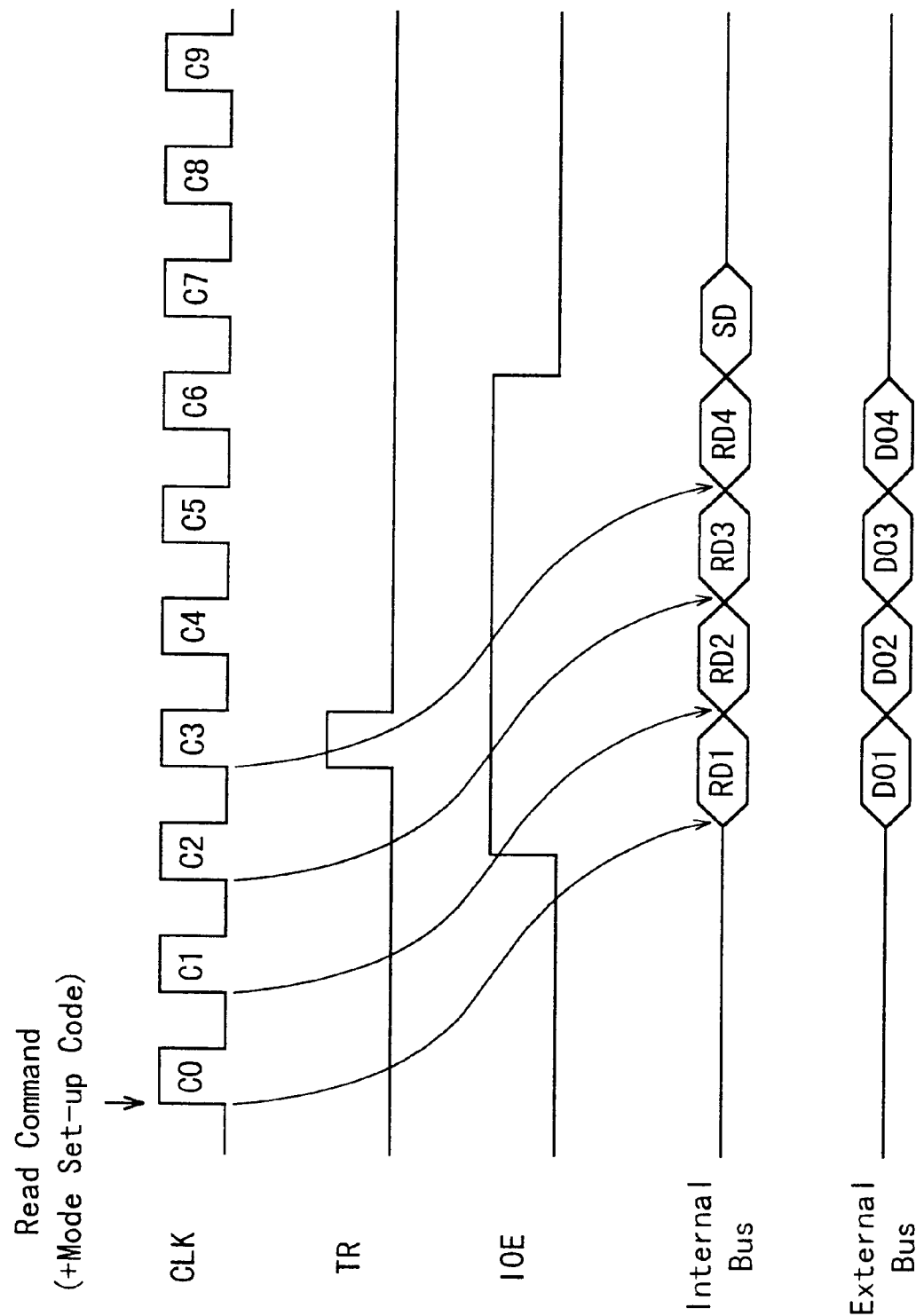

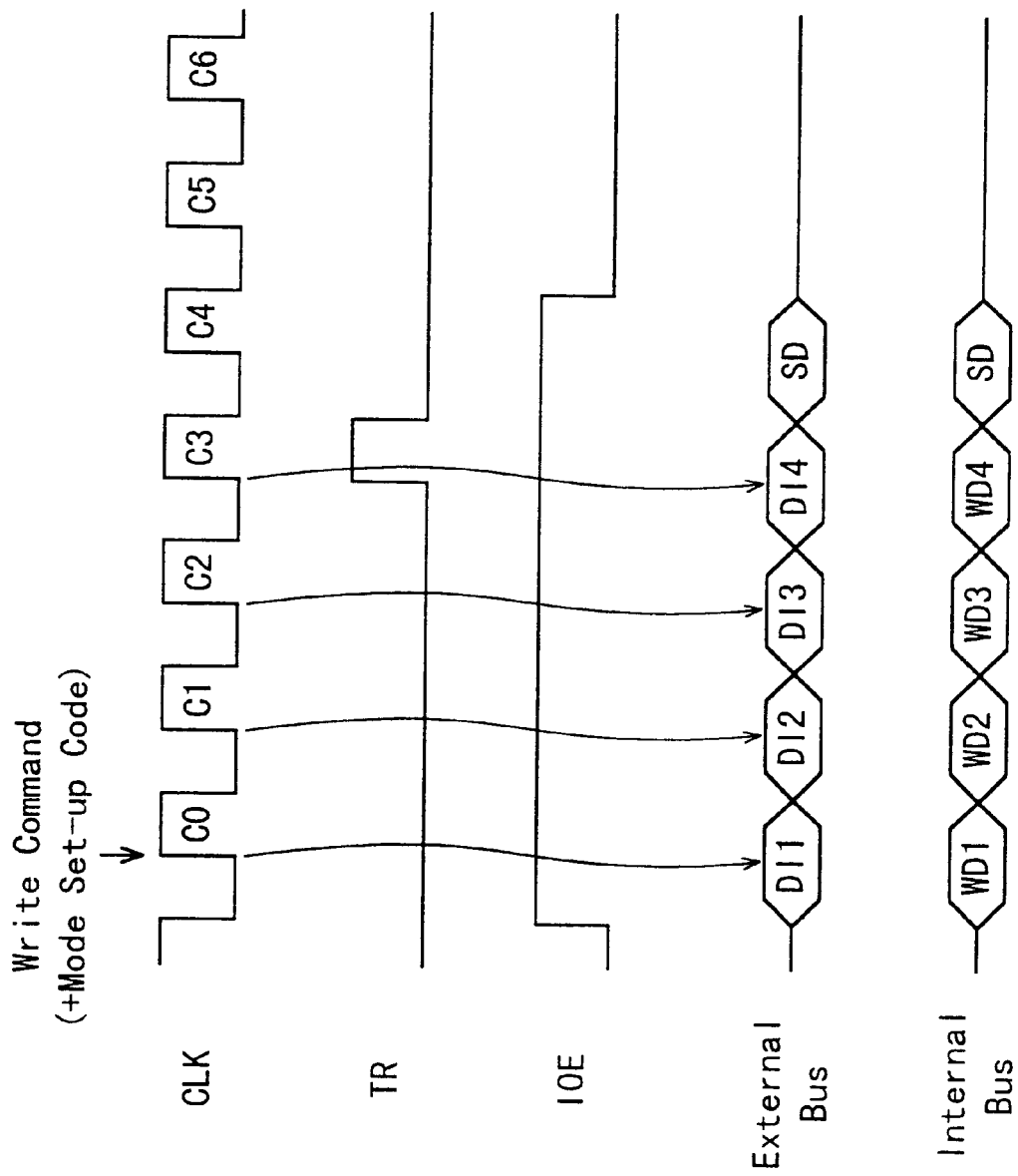

SEMICONDUCTOR MEMORY FOR OPERATION IN A PLURALITY OF OPERATIONAL MODES

BACKGROUND OF THE INVENTION

The invention relates to a semiconductor memory, and more particularly, to set-up of a mode of operation of a semiconductor device.

A synchronous graphic RAM (SGRAM) is used to efficiently process of large amounts of data, such as image data. The SGRAM operates in a number of operational modes which allow it to perform rapid data processing. These modes include a burst mode, a block write mode and the like. The burst operation refers to a read/write operation with respect to a memory core in which information is sequentially accessed by specifying a plurality of column addresses. The block write operation performs a data write operation into a plurality of memory cells using a plurality of column select signals.

Referring to FIG. 1, a conventional SGRAM 10 formed on a single semiconductor substrate, such as a single crystal silicon substrate using a known semiconductor integrated circuit manufacturing technology is known. The SGRAM 10 is connected to a system 32 which provides the SGRAM 10 with a variety of signals such as a clock signal CLK, a distribution enable signal CKE, instruction code signals which constitute operation commands, an address signal A10–A0 (where A10 represents the most significant bit and A0 the least significant bit), a data signal D7–D0 (where D7 represents the most significant bit and D0 the least significant bit), a data mask signal DQM and the like. The SGRAM 10 is controlled in accordance with the various signals from the system 32 in synchronism with the clock signal CLK, in a similar manner as a synchronous DRAM.

The SGRAM 10 includes a memory core 12, a clock buffer 14, an instruction decoder 16, an address buffer register 18, an input/output (I/O) buffer 20, a control signal latch 22 and a column address counter 24. The SGRAM 10 additionally includes operational mode registers such as a mode register 26, a color register 28 and a mask register 30, where the color register 28 and the mask register 30 represent special mode registers. Access information, which defines individual operational modes of the SGRAM 10, is stored or loaded in the mode register 26, the color register 28 and the mask register 30.

The memory core 12 has a multitude of dynamic memory cells which are disposed in a matrix array. The memory core 12 is provided with a row decoder and a column decoder, which are known in the art, and a memory cell has a select terminal connected to a word line and a data input terminal connected to a data line.

The clock buffer 14 receives the clock signal CLK (shown in FIG. 2) and the distribution enable signal CKE from the system 32. In response to the distribution enable signal CKE of a high level (or logical "1" level), the clock buffer 14 provides the clock signal CLK to the instruction decoder 16, the address buffer register 18 and the I/O buffer 20.

A summary of the operation of the SGRAM 10 will be given. An operational mode such as the burst operation, the block write operation or the like is initially set up, and a read/write operation then follows in accordance with the operational mode specified. The system 32 provides an address signal A10–A0, as access information which specifies the operational mode, to the SGRAM 10. During the read/write operation, the system 32 provide the address signal A10–A0 to the SGRAM 10 to serve as a row address signal which selects a word line for the memory core 12 and as a column address signal which selects a data line for the memory core 12. All bits in the address signal A10–A0 are used to form the row address signal. Part of the address signals A10–A0, for example, eight bits A7–A0 are used as the column address signal. The three most significant bits A10–A8 of the address signal are not used in the selection of a data line.

The address buffer register 18 receives the clock signal CLK from the clock buffer 14 and receives the address signal A10–A0 in synchronism with the clock signal CLK. During the set-up of an operational mode, the address buffer register 18 loads bits A7–A0 of the address signal into the mode register 26 by way of an internal bus as the access information. The access information in the mode register 26 is also provided to the control signal latch 22. In addition, the address buffer register 18 provides the address signal A10–A0 to the instruction decoder 16. The most significant bit A10 of the address signal is used, for example, to designate one of the mode register 26, the color register 28 and the mask register 30. During the read/write operation, the address buffer register 18 provides the row address signal A10–A0 to the row decoder via an internal bus and also provides the column address signal A7–A0 to the column address counter 24.

The column address counter 24 is provided to implement the burst operation. The column address counter 24 includes a burst counter, not shown, which forms a column address signal, and a burst end counter, not shown, which restricts the number of column address signals formed. The column address signal A7–A0 from the address buffer register 18 is loaded into the burst counter as an initial value. The mode register 26 has stored therein a burst length as access information, which is provided to the burst end counter. In this manner, the burst end counter is preset with burst length information, which is then counted down or decremented to produce an underflow signal. The burst counter is incremented from the initial value until the burst end counter underflows, thus sequentially producing column address signals. The column address signal produced in this manner is decoded by the column decoder within the memory core 12 into a select signal for a particular data line. Data write-in or data read-out into or from a selected memory cell then takes place. After having produced a number of column address signals which depends on the burst length information, the column address counter 24 produces an internal trigger signal TR which indicates the end of the column address signals.

The I/O buffer 20 receives the clock signal CLK from the clock buffer 14 and receives the data signal D7–D0 from the system 32 in accordance with the clock signal CLK. In addition, the I/O buffer 20 delivers the data signal D7–D0 which is read from the memory core 12 to the system 12 in accordance with the clock signal CLK. During the set-up of the operational mode, if either the color register 28 or the mask register 30 is selected, the I/O buffer 20 loads the data signal D7–D0 into the color register 28 or the mask register 30 as access information. During the write operation, the I/O buffer 20 feeds the data signal D7–D0 to the memory core 12. The data signal D7–D0 from the I/O buffer 20 is amplified by a write amplifier, not shown, before it is transmitted onto the data line in the memory core 12 and then that the transmitted signal is written into selected memory cells. During the read operation, data signal D7–D0 from the data line in the memory core 12 is amplified in by main amplifier, not shown, and then delivered by the I/O buffer 20 to the system 32. During the burst operation, the I/O buffer 20 receives one column address from the system 32, and sequentially produces a predetermined number of column address signals inclusive of the received one, which consecutively follow the received column address signal for performing a read/write operation.

The mode register 26 includes a plurality of identically constructed registers, not shown, which correspond to the address signal A10–A0. Access information is loaded into the mode register 26 in accordance with control signals fed from the control signal latch 22. The control signal latch 22 produces control signals for the mode register 26 in response to a predetermined status signal from the instruction decoder 16. For example, the access information loaded into the mode register 26 includes a burst length BL and a CAS latency CL. The burst length BL represents the number of times access is made to the memory core 12 in synchronism with the clock signal CLK. CAS latency CL represents a number of cycles of the clock signal CLK from the time when the column address strobe signal /CAS assumes an active level until data delivery is initiated. For example, when CL=2 and BL=4, the data delivery is commenced in response to the second pulse of the clock signal CLK which occurs after the column address strobe signal /CAS has assumed its active level, and is continued until the fifth pulse of the clock signal CLK since the commencement of the data delivery.

The instruction decoder 16 receives an instruction code signal contained in the operation command signal which is fed from the system 32. The instruction code signal includes a read instruction, a write instruction, and a mode set-up instruction code which is used to set up the operational mode of the SGRAM 10. The mode set-up instruction code corresponds to a particular combination of levels of a chip select signal /CS, a row address strobe signal /RAS, a column address strobe signal /CAS, a write enable signal /WE and a block write signal DSF.

The instruction decoder 16 receives the clock signal CLK from the clock buffer 14, and receives the instruction code signal from the system 32 and the address signal A10–A0 from the address buffer register 18 in synchronism with the clock signal CLK. The decoder 16 decodes the most significant bit A10 in the address signal as well as the instruction code signal into an internal instruction code, which is delivered to the control signal latch 22.

The operation command additionally includes a register set command, a read command, a write command and a block write command. The register set command includes a mode register set command and a special mode register set command.

When the chip select signal /CS-low, the row address strobe signal /RAS-high, the column address strobe signal /CAS-high, the write enable signal /WE-high and the block write enable signal DSF-low are fed from the system 32, the instruction decoder 16 selects the mode register set command. When the mode register set command is selected, the address signal A10–A0 is loaded into the mode register 26 as access information (operational mode) for the SGRAM 10.

When the chip select signal /CS-low, the row address strobe signal /RAS-high, the column address strobe signal /CAS-high, the write enable signal /WE-high and the block write enable signal DSF-high are fed from the system 32, the instruction decoder 16 selects the special mode register set command. At this time, if the most significant bit A10 of the address signal A10–A0 is a high, data signal D7–D0 is loaded into the color register 28 as access information (operational mode) for the SGRAM 10. Conversely, if the bit A10 is low, the instruction decoder 16 loads data signal D7–D0 into the mask register 30 as access information (operational code) for the SGRAM 10.

The read command controls a read operation in accordance with the access information in the mode register 26, selects a data line in the memory core 12 and activates the I/O buffer 20. When the read command is selected, the mode register 26 stores information relating to the burst operation. When the chip select signal /CS-low, the column address strobe signal /CAS-low, the row address strobe signal /RAS-high, the write enable signal /WE-high and the block write enable signal DSF-low are fed from the system 32, the instruction decoder 16 selects the read command, which is then decoded into an internal instruction code.

Upon receiving the read command (the internal instruction code) from the instruction decoder 16, the control signal latch 22 instructs the memory core 12 to perform a burst read operation which conforms to the burst length information stored in the mode register 26. The address buffer register 18 then feeds the column address signal A7–A0 to the column address counter 24, which uses it as an initial value to produce a number of column address signals which correspond to the burst length and which consecutively follow the initial value in a sequential manner. Data from the memory cells connected to the data line selected by the column address signal are delivered to the system 32 via the I/O buffer 20. The data delivery takes place according to the CAS latency loaded in the mode register 26.

The write command controls a write operation in accordance with the access information in the mode register 26, selects a data line in the memory core 12 and activates the I/O buffer 20. When the write command is selected, a burst operation is set up in the mode register 26. When the chip select signal /CS-low, the column address strobe signal /CAS-low, the write enable signal /WE-low, the row address strobe signal /RAS-high and the block write enable signal DSF-low are fed from the system 32, the instruction decoder 16 selects the write command, which is decoded into an internal instruction code.

Upon receiving the write command (the internal instruction code), the control signal latch 22 instructs the memory core 12 to perform a burst write operation which conforms to the burst length information stored in the mode register 26. The address buffer register 18 feeds the address signal A7–A0 to the column address counter 24 as a column address signal, which is then used as an initial value to produce a number of column address signals which consecutively follow the initial value and which correspond to the burst length. Data signal D7–D0 is fed via the I/O buffer 20 to be written into memory cells in the memory core 12 which are selected by the column address signals.

The block write command controls a write operation in accordance with the access information in the mode register 26, the color register 28 and the mask register 30, and is used to activate the I/O buffer 20. When the chip select signal /CS-low, the column address strobe signal /CAS-low, the write enable signal /WE-low, the row address strobe signal /RAS-high and the block write signal DSF-high are fed from the system 32, the instruction decoder 16 selects the block write command, which is then decoded into an internal instruction code.

Upon receiving the block write command, the control signal latch 22 instructs a block write operation to the color register 28 and the mask register 30 via the mode register 26.

The address buffer register 18 then feeds the address signal A10–A0 to the column address counter 24 as a column address signal, which is used therein as an initial value to produce a number of column address signals which consecutively follow the initial value. In this manner, a plurality of data lines which correspond to the plurality of column address signals are simultaneously selected, and the same data is fed to the data lines in a collective manner to be written into corresponding memory cells.

It can be seen from the above description that in order to load access information into the mode register 26, the color register 28 and the mask register 30, it is necessary that the system 32 feeds a signal corresponding to the register set command to the instruction decoder 16 in a similar manner as for the read or the write command.

Referring now to FIG. 2, an operation which follows a read operation in order to modify access information in the mode register 26 will be described. It is assumed that the access information which is loaded in the mode register 26 contains the CAS latency (CL=3) and the burst length (BL=4). A read command is fed to the instruction decoder 16 in response to a first pulse C0 of the clock signal CLK. At a fourth pulse C3, an internal trigger signal TR indicating the termination of the burst operation is produced by the column address counter 24. After the read command is fed, the instruction decoder 16 maintains an output control signal IOE at its high level (or logical "1" level) for an interval from a third to a seventh pulse C2–C6. Data read RD1–RD4 on an internal bus is delivered to the system 32 via the I/O buffer 20 during the interval the output control signal IOE assumes its high level.

When the system 32 feeds a register set command in following the read operation, it is preferred for correct data transfer that an interval be provided during which a command is not fed subsequent to the termination of the read operation until a predetermined time interval passes or a predetermined number of pulses in the clock signal CLK are counted after the termination of the read operation. It is also possible to eliminate such time interval and to feed the set command immediately following the seventh pulse C6 of the clock signal CLK, thus at eighth pulse C7, as shown in FIG. 2, while feeding access information to the mode register 26. In FIG. 2, a signal SD represents data corresponding to a mode set-up command.

However, even in such an instance, a time interval must be provided, as may be represented by a predetermined number of pulses, between feeding the register set command and feeding subsequent access information. Thus, subsequent access information would be fed at the tenth cycle C9 or later, thus wasting two or more cycles of the clock signal CLK, which degrades the data transfer efficiency. Accordingly, where access information (operational mode) to be loaded into the mode register 26, the color register 28 and the mask register 30 is frequently changed, there is a degradation in the data transfer rate.

SUMMARY OF THE INVENTION

To achieve the above objective, the present invention provide a semiconductor memory for operation in a plurality of operational modes including at least a read, a write and a set up mode, the semiconductor memory comprising: an instruction decoder, receiving an instruction code signal for setting up one of the plurality of operational modes and a mode set-up instruction signal for modifying the operational mode set up by the instruction code signal, for decoding the instruction code signal and the mode set-up instruction signal; at least one register connected to the instruction decoder for storing operational mode information corresponding to the decoded instruction code signal; a memory core for storing data, wherein the memory core is accessed in the operational mode which is set up; and a mode set-up control circuit connected to the instruction decoder, wherein the mode set-up control circuit receives the decoded mode set-up instruction signal and loads corresponding operational mode information into the register in response to the termination of the previously set up operational mode.

The present invention further provide a method of loading operational mode information for a semiconductor memory which is adapted to operate in a plurality of operational modes including at least a read, a write and a set-up mode operation, the method comprising the steps of: loading the operational mode information in a register; collectively providing an instruction code signal which sets up one of the plurality of operational modes in accordance with the operational mode information and a mode set-up instruction signal for modifying the previously set up operational mode; executing an operation specified by the operational mode which is set up; and reloading the operational mode information in accordance with the mode set-up instruction signal immediately after the termination of the operation.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a timing chart illustrating a modification of mode set up for the read operation of the SGRAM of FIG. 3; and FIG. 5 is a timing chart illustrating a modification of a mode set up for the write operation of the SGRAM of FIG. 3.

DETAILED DESCRIPTION OF THE PREFERRED EMBODIMENTS

Figure 1:
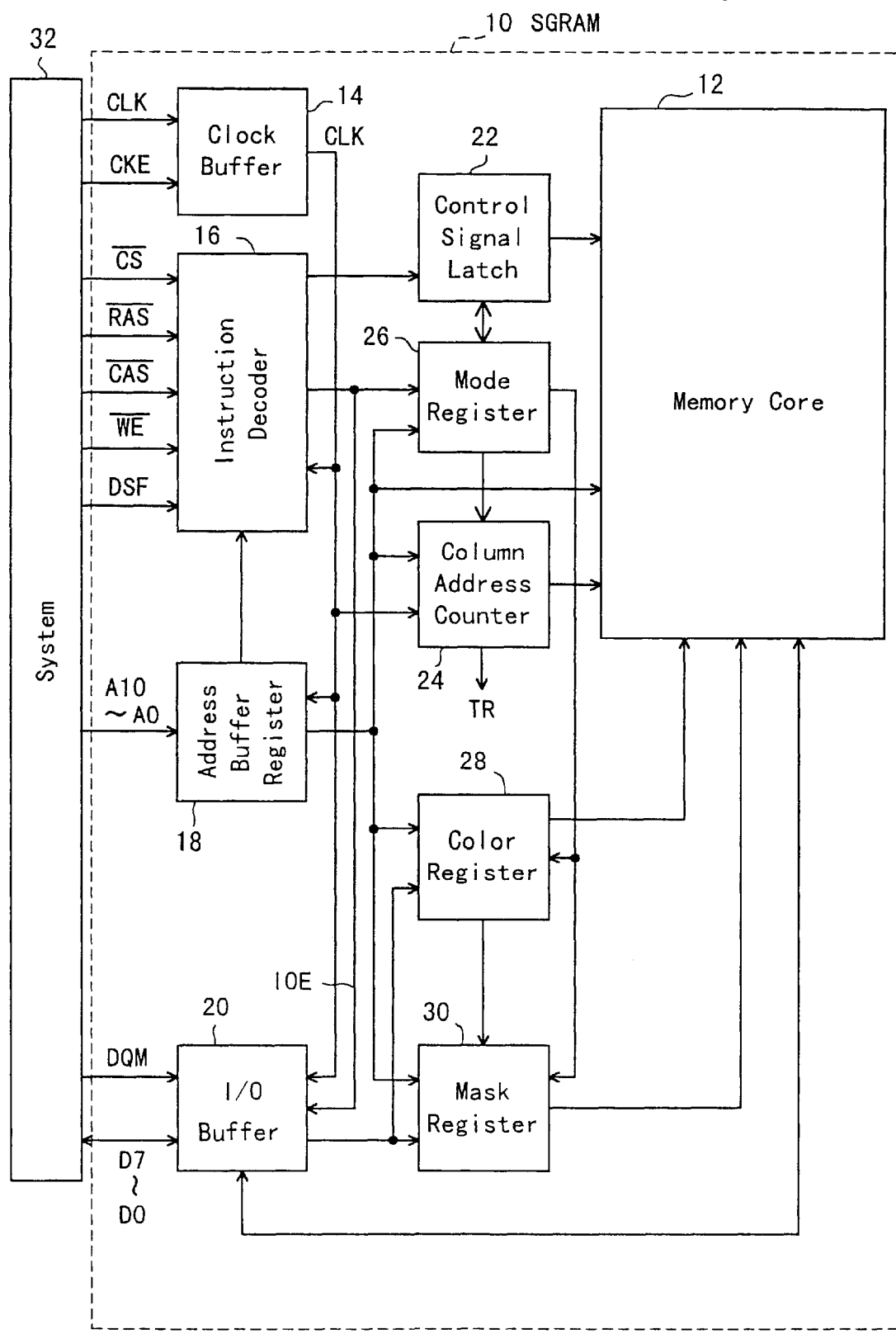
FIG. 1 is a schematic block diagram of a conventional SGRAM.
Figure 2:
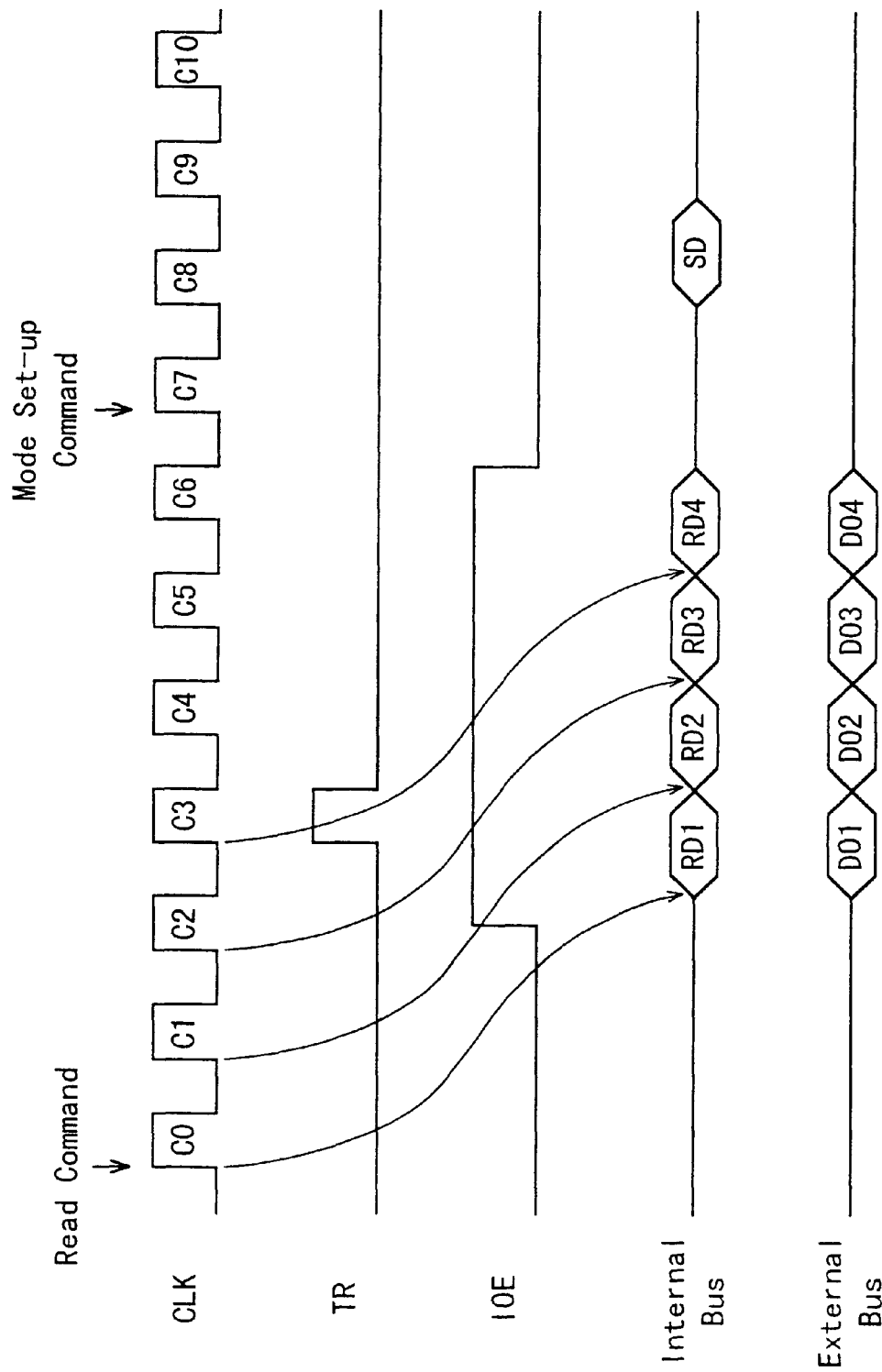
FIG. 2 is a timing chart illustrating a modification of a mode set up for the SGRAM of FIG. 1.

In the drawings, like numerals are used for like elements throughout.

Figure 3:
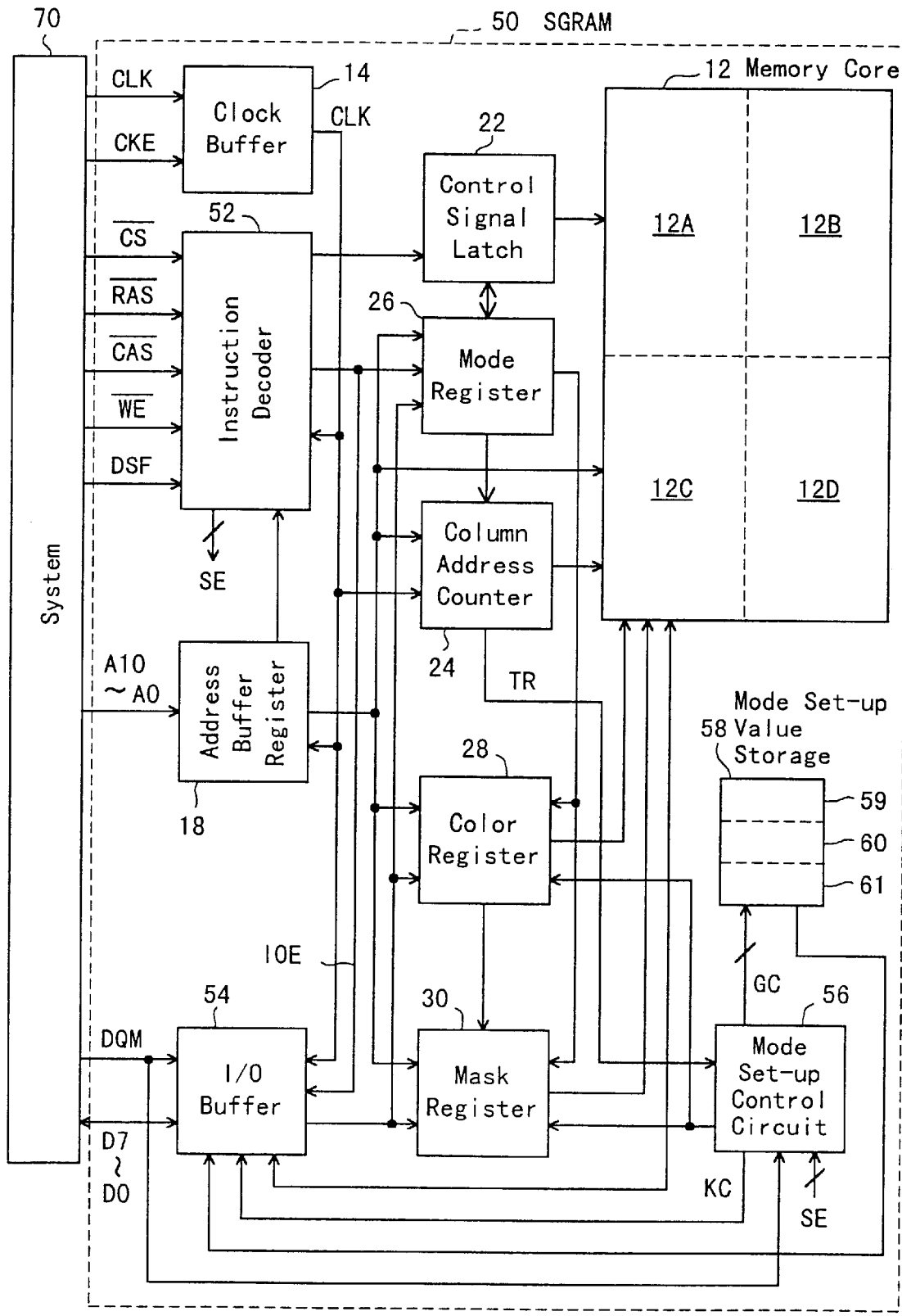
FIG. 3 is a schematic block diagram of an SGRAM according to one embodiment of the present invention.

Referring to FIGS. 3 to 5, a SGRAM 50 according to one embodiment of the present invention will now be described, principally dealing with differences from the prior art SGRAM 10 in FIG. 1. As shown in FIG. 3, the SGRAM 50 includes a mode set-up value storage 58 and a mode set-up control circuit 56, in addition to the arrangement of the conventional SGRAM 10.

The mode set-up control circuit 56 is connected to the column address counter 24, registers 28 and 30, an instruction decoder 52, an input/output (I/O) buffer 54 and a system 70 and operates to set up access information (operational mode) for the mode register 26, the color register 28 and the mask register 30.

The mode set-up value storage 58 preferably comprises a memory such as a RAM, a ROM or a register, which is connected to the mode set-up control circuit 56 and the I/O buffer 54. Access information which is to be loaded into the mode register 26, the color register 28 and the mask register 30 is stored in the storage 58. Specifically, the storage 58 preferably includes a plurality of storage regions 59–61. Access information (the burst length BL and the CAS latency CL) which is to be loaded into the mode register 26 is initially or first stored in the storage region 59, access information which is to be loaded into the color register 28 is stored in the storage region 60, and access information which is to be loaded into the mask register 30 is stored in the storage region 61.

When a word line in the memory core 12 is selected during the read/write operation, all of the bits in the address signal A10–A0 are used to form a row address signal. In contrast, when a data line in the memory core 12 is selected, part of the bits in the address signal A10–A0, for example, A7–A0, are to form a column address signal. In this instance, the three most significant bits A10–A8 in the address signal are used as a mode set-up instruction used to load access information into the mode register 26, the color register 28 and the mask register 30. Accordingly, the address signal A10–A0 includes both information used to select a data line and information used to load an operational mode.

The I/O buffer 54 includes a switch circuit, not shown, which selects one of the mode register 26, the color register 28 and the mask register 30 and connects the selected register with the storage 58 or an external circuit (system 70).

The instruction decoder 52 decodes an instruction code signal (/CS, /RAS, /CAS, /WE, DSF) into an internal instruction code, which is then delivered to the control signal latch 22. The instruction decoder 52 determines whether an operational mode in the mode register 26 is to be loaded or reloaded in accordance with the three most significant bits A10–A8 in the column address signal. Specifically, the instruction decoder 52 decodes a mode set-up instruction comprising the three most significant bits A10–A8 in the column address signal to produce a set-up control signal SE indicating a result of the determination, and the set-up control signal SE is delivered to the set-up control circuit 56.

The mode set-up instruction includes a plurality of internal register set commands (briefly referred to as internal set commands) and a plurality of external register set commands (similarly referred to as "external set commands"). An internal set command loads access information stored within the storage 58 into each of the registers 26, 28 and 30. An external set command loads access information supplied as a data signal D7–D0 from the system 70 into each of the registers 26, 28 and 30. For example, when the bits A10–A8 are "010", the mode set-up instruction represents an internal set command which defines access information in the mode register 26. When the bits A10–A8 are "011", the mode set-up instruction represents an external set command which defines access information in the mode register 26.

The mode set-up control circuit 56 receives the set-up control signal SE from the instruction decoder 52 and the internal trigger signal TR from the column address counter 24. The set-up control signal SE includes set-up information which corresponds to the internal or the external set command, but it may also include information that a mode set-up value has not been modified.

When the set-up control signal SE corresponds to an internal set command, the control circuit 56 produces a reload signal or switched control signal KC in response to the internal trigger signal TR. The control circuit 56 delivers the switched control signal KC to the I/O buffer 54 to switch the switch circuit, whereby one of the mode register 26, the color register 28 and the mask register 30 is connected to the storage 58 via the I/O buffer 54 and an internal bus. In this instance, the internal bus is not connected to the external bus or the system 70. The control circuit 56 produces an output control signal GC, which is delivered to the storage 58. In response to the output control signal GC, the storage 58 delivers access information stored in one of the storage regions 59–61 to one of the registers 26, 28 and 30, as specified by the I/O buffer 54. In this manner, a predetermined access information is loaded into the registers 26, 28 and 30 which is specified by the mode set-up instruction.

When the set-up control signal SE corresponds to an external set command, the control circuit 56 delivers the switched control signal KC to the I/O buffer 54, designating one of the registers 26, 28 and 30, and the designated one of the registers 26, 28 and 30 is connected to the system 70 via the I/O buffer 54. Thus, access information (or data signal D7–D0) from the system 70 is loaded into the specified one of the registers 26, 28 and 30.

Referring to FIG. 4, the read operation of the SGRAM 50 will now be described. In this instance, access information in the mode register 26 is modified using access information stored in the storage 58. It is assumed that access information in the mode register 26 includes the CAS latency (CL=3) and the burst length (BL=4).

When the read command is fed at a first pulse C0 of the clock signal CLK, the internal trigger signal TR indicating the end of the burst operation is produced by the column address counter 24 at a fourth pulse C3. The output control signal IOE is maintained at its high level (logical "1" level) from a third to a seventh pulse C2–C6 in response to the read command. Data read RD1–RD4 on the internal bus is delivered via the I/O buffer 54 to the system 70 during the time the output control signal IOE assumes its high level.

In response to the falling edge of the output control signal IOE, access information read from the storage region 59 of the storage 58 is delivered to the mode register 26 as set-up data SD. Specifically, in response to the internal trigger signal TR, the control circuit 56 applies the switched control signal KC to the I/O buffer 54, whereupon the internal bus is connected to the storage region 59 of the storage 58. In response to the output control signal GC from the control circuit 56, the storage 58 transfers the access information from the storage region 59 as the set-up data SD. The transferred set-up data SD (access information) is loaded into the mode register 26. In this manner, the internal bus is utilized in the transfer of access information to the mode register 26 immediately following the transfer of the data read RD1–RD4. Consequently, the data transfer efficiency is improved and a high data transfer rate is secured.

Referring to FIG. 5, the operation of the SGRAM 50 to modify access information in the mode register 26 subsequent to the write operation will now be described. In this instance, access information from the system 70 is loaded into the mode register 26. It is assumed that the access information loaded in the mode register 26 includes the CAS latency (CL=3) and the burst length (BL=4).

When the write command is fed at a first pulse C0, the internal trigger signal TR indicating the end of the burst operation is produced by the column address counter 24 at a fourth pulse C3. The input control signal IOE is maintained at a high level (logical "1") for an interval from the first to a fifth pulse C0–C4. Input data DI1–DI4 from the system 70 is input to the I/O buffer 54 during the time that the input control signal IOE is high. The input data DI1–DI4 is transferred from the I/O buffer 54 to the memory core 12 via the internal bus as write data WD1-WD4.

At the fifth pulse C4, the control circuit 56 applies the switched control signal KC to the I/O buffer 54 in response to the internal trigger signal TR. In response to the switched control signal KC, the I/O buffer 54 connected between the mode register 26 and the external bus (or the system 70). Accordingly, access information from the system 70 is transferred to the I/O buffer 54 as set-up data SD. The transferred set-up data is loaded into the mode register 26. In this manner, the internal bus is utilized in the transfer of access information to the mode register 26 immediately following the transfer of the write data WD1–WD4. Consequently, the data transfer efficiency on the internal bus is improved and a high data transfer rate is secured.

As described above, a mode set-up code which is used to set up an operational mode in the registers 26, 28 and 30 is added for an operation command such as a read command, a write command or the like. Access information is loaded into a specified one of the registers 26, 28 and 30 in response to the internal trigger signal TR indicating the end of operation of the command. Accordingly, the length of time required to set up the operational mode in the registers 26, 28 and 30 is reduced, with consequence that the data transfer efficiency on the internal bus is improved and a high data transfer rate is secured. In addition, the number of instructions required to set up and to modify the operational mode in the registers 26, 28 and 30 is reduced.

It should be apparent to those skilled in the art that the present invention may be embodied in many other specific forms without departing from the spirit or scope of the invention. Particularly, it should be understood that the invention may be embodied in the following forms.

The storage 58 may include only one storage region. In this instance, a specific one of the mode set-up values in the registers 26, 28 and 30 is stored in the storage 58. The instruction decoder 52 delivers only a single kind of set-up control signal SE in accordance with the mode set-up instruction. In response to this single set-up control signal SE, the control circuit 56 reloads the mode set-up value in the storage 58 into a specific one of the registers 26, 28 and 30. Alternatively, the storage 58 may include a plurality of storage regions for each of the registers 26, 28 and 30.

The access information from the system 70 may be loaded into any one of the registers 26, 28 and 30 subsequent to the completion of the read operation. Alternatively, the access information stored in the storage 58 may be loaded into any one of the registers 26, 28 and 30 subsequent to the completion of the write operation.

Instead of using bits A10–A8, which are part of the column address signal, as a mode set-up code, a signal which is devoted to set up a mode may be added to the operation command.

The memory core 12 may be divided into a plurality of banks 12A, 12B, 12C and 12D, (FIG. 3) each of which may be associated with a corresponding control circuit 56. In this instance, a storage 58 may be provided separately for each of the banks 12A, 12B, 12C and 12D. Information representing an operational mode is loaded for each of the banks 12A, 12B, 12C and 12D.

The mode set-up value storage 58 may be omitted, and access information from the system 70 may be loaded into one of the registers 26, 28 and 30 subsequent to the completion of the read and the write operation.

Therefore, the present examples and embodiments are to be considered as illustrative and not restrictive and the invention is not to be limited to the details given herein, but may be modified within the scope and equivalence of the appended claims.

What is claimed is:

1. A semiconductor memory for operation in a plurality of operational modes including at least a read, a write and a set up mode, the semiconductor memory comprising:

an instruction decoder, receiving an instruction code signal for setting up one of the plurality of operational modes, receiving a mode set-up instruction signal for modifying operational mode information defining a previously set up operational mode, and decoding the instruction code signal and the mode set-up instruction signal;

at least one register connected to the instruction decoder for storing the operational mode information corresponding to the decoded instruction code signal;

a memory core for storing data, wherein the memory core is accessed in the operational mode which is set up; and a mode set-up control circuit connected to the instruction decoder, wherein the mode set-up control circuit receives the decoded mode set-up instruction signal and loads the operational mode information corresponding to the decoded mode set-up instruction signal into the register in response to the termination of the previously set up operational mode.

2. The semiconductor memory according to claim 1, wherein the mode set-up control circuit generates a load signal subsequent to the termination of the previously set up operational mode, the semiconductor memory further comprising:

an instruction generation circuit connected to the instruction decoder for generating the instruction code signal and the mode set-up instruction signal; and an input/output buffer connected to the register, the mode set-up control circuit, the memory core and the instruction generation circuit for delivering data between the memory core and the instruction generation circuit, wherein the input/output buffer loads the operational mode information into the register in accordance with the load signal from the mode set-up control circuit.

3. The semiconductor memory according to claim 2, further comprising a storage connected to the mode set-up control circuit and the input/output buffer for storing the operational mode information, wherein the mode set-up control circuit controls the storage and the input/output buffer such that the operational mode information stored in the storage is provided to the input/output buffer prior to being loaded in the register.

4. The semiconductor memory according to claim 3, wherein the storage includes at least one storage region which stores the operational mode information.

5. The semiconductor memory according to claim 4, wherein the storage includes any one of a RAM, a ROM and a register.

6. The semiconductor memory according to claim 4, wherein the operational mode information stored in the storage includes a latency indicating a timing when the previously set up operation begins and a burst length representing the duration over which the operation continues.

7. The semiconductor memory according to claim 2, wherein the instruction decoder determines whether the operational mode information is to be loaded in accordance with the mode set-up instruction signal, and the mode set-up control circuit loads the operational mode information into the register in accordance with the determination made by the instruction decoder.

8. The semiconductor memory according to claim 2, further comprising a counter connected to the register and mode set-up control circuit, wherein the register stores information representing a burst length indicating an interval during which the operational mode is executed, and wherein the counter receives the burst length information from the register and produces an internal trigger signal upon termination of the operational mode, and the mode set-up control circuit produces the load signal in response to the internal trigger signal.

9. The semiconductor memory according to claim 2, wherein the operational mode information loaded into the register includes information received from the instruction generation circuit.

10. The semiconductor memory according to claim 2, further comprising a buffer register connected between the instruction generation circuit and the instruction decoder for receiving a signal comprising a predetermined number of bits from the instruction generation circuit and for delivering the signal to the instruction decoder, wherein the signal includes an address signal for specifying an address within the memory core and the mode set-up instruction signal.

11. The semiconductor memory according to claim 10, wherein the signal provided to the buffer register by the instruction generation circuit comprises eleven bits, the three most significant bits being the mode set-up instruction signal.

12. The semiconductor memory according to claim 1, wherein the memory core comprises a plurality of blocks and the operational mode information is provided for each block.

13. A method of loading operational mode information for a semiconductor memory which is adapted to operate in a plurality of operational modes including at least a read, a write and a set-up mode operation, the method comprising the steps of:

loading the operational mode information in a register;

collectively providing an instruction code signal which sets up one of the plurality of operational modes in accordance with the operational mode information and a mode set-up instruction signal for modifying the operational mode information defining the previously set up operational mode;

executing an operation specified by the operational mode which is set up; and reloading the operational mode information in accordance with the mode set-up instruction signal immediately after the termination of the operation.

14. The method according to claim 13, further comprising the step of producing a trigger signal indicating when the operational mode has been terminated, wherein the reloading step is executed in response to the trigger signal.

* * * * *